United States Patent
Joseph et al.

(10) Patent No.: US 8,518,718 B2
(45) Date of Patent: Aug. 27, 2013

(54) MAGNETIC SPIN SHIFT REGISTER MEMORY

(75) Inventors: Eric A. Joseph, White Plains, NY (US); Stuart S. P. Parkin, San Jose, CA (US); Mary B. Rothwell, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/613,313

(22) Filed: Sep. 13, 2012

(65) Prior Publication Data

US 2013/0005053 A1    Jan. 3, 2013

Related U.S. Application Data

(62) Division of application No. 12/833,446, filed on Jul. 9, 2010.

(51) Int. Cl.
*H01L 21/00* (2006.01)

(52) U.S. Cl.
USPC ............. 438/3; 257/E21.003; 257/E43.006

(58) Field of Classification Search
USPC ................. 438/3; 257/E21.002, E43.006
See application file for complete search history.

(56) References Cited

U.S. PATENT DOCUMENTS

| | | | |
|---|---|---|---|
| 5,328,101 | A | 7/1994 | Munshi |
| 6,071,822 | A | 6/2000 | Donohue et al. |
| 7,551,469 | B1 | 6/2009 | Parkin |
| 7,626,844 | B1 * | 12/2009 | Moriya et al. ............. 365/80 |
| 2003/0052081 | A1 | 3/2003 | Koops |
| 2007/0015371 | A1 | 1/2007 | Olynick et al. |
| 2008/0080234 | A1 | 4/2008 | Iwata et al. |

OTHER PUBLICATIONS

International Search Report, International Application No. PCT/US11/38877; International Filing Date: Jun. 2, 2011; Date of Mailing: Sep. 22, 2011.
International Search Report—Written Opinion; International Application No. PCT/US11/38877; International Filing Date: Jun. 2, 2011; Date of Mailing: Sep. 22, 2011.
International Preliminary Report on Patentability for International Application No. PCT/US2011/038877 with International Filing Date: Jun. 2, 2012, Issued: Jan. 15, 2013, 5 pages.

* cited by examiner

*Primary Examiner* — David S Blum
(74) *Attorney, Agent, or Firm* — Cantor Colburn LLP; Louis Percello

(57) ABSTRACT

A method for forming a memory device includes forming a cavity having an inner surface with an undulating profile in a substrate, depositing a ferromagnetic material in the cavity, forming a reading element on the substrate proximate to a portion of the ferromagnetic material, and forming a writing element on the substrate proximate to a second portion of the ferromagnetic material.

14 Claims, 3 Drawing Sheets

MAGNETIC SPIN SHIFT REGISTER MEMORY

CROSS-REFERENCE TO RELATED APPLICATIONS

This is a divisional application of and claims priority from U.S. application Ser. No. 12/833,446, filed on Jul. 9, 2010, the entire contents of which are incorporated herein by reference.

BACKGROUND

The present invention relates to memory devices, and more specifically, to forming racetrack memory devices.

A racetrack memory device stores information in the form of magnetic domain walls in magnetic nanowires or "racetracks". The domain walls are moved backward and forward along the nanowires using current pulses, in which the electrons carrying the current are spin polarized. The spin polarized current carries spin angular momentum, which is transferred to the domain walls causing them to move in the direction of the electron flow.

BRIEF SUMMARY

According to one embodiment of the present invention, a method for forming a memory device includes forming a cavity having an inner surface with an undulating profile in a substrate, depositing a ferromagnetic material in the cavity, forming a reading element on the substrate proximate to a portion of the ferromagnetic material, and forming a writing element on the substrate proximate to a second portion of the ferromagnetic material.

According to another embodiment of the present invention a memory device includes a shift register including a ferromagnetic material disposed in a cavity having an undulating inner surface profile, a reading element disposed proximal to a portion of the shift register, and a writing element disposed proximal to a second portion of the shift register.

According to yet another embodiment of the present invention a method for forming a memory device includes forming a first cavity having rib portions in a substrate using an isotropic etching and passivating polymer deposition processes, depositing a ferromagnetic material in the cavity, the ferromagnetic material including magnetic domains partially defined by the undulating profile of the cavity, forming a reading element proximal to a portion of the ferromagnetic material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
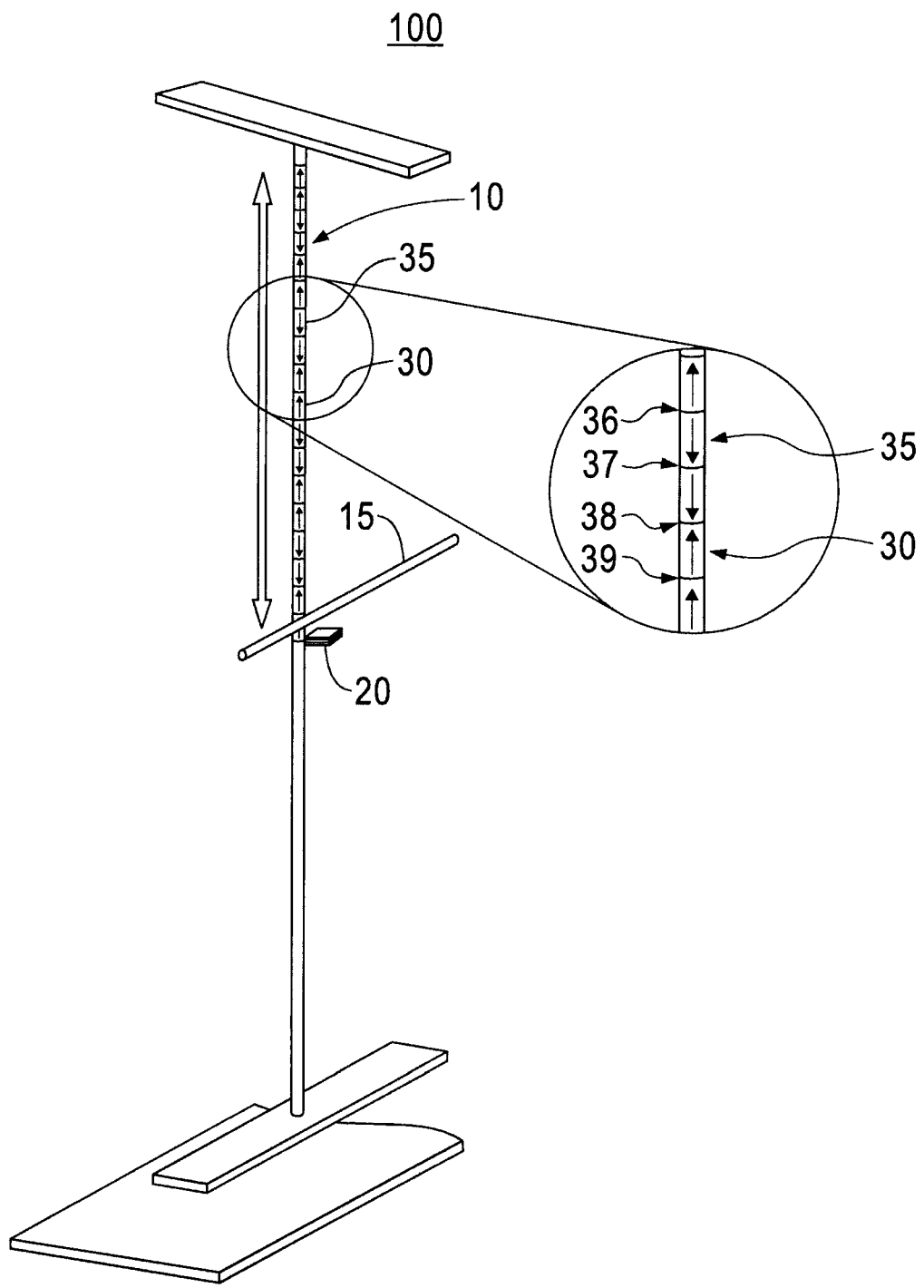
FIG. 1 illustrates a perspective view of an exemplary embodiment of a magnetic shift register memory device.

FIG. 1 illustrates an exemplary embodiment of a magnetic shift register memory device 100. The device 100 includes a magnetic shift register 10 that includes a writing element 15 and a reading element 20. The magnetic shift register 10 includes a data column 25 formed from fine wire (or track) that may include a ferrimagnetic or ferromagnetic material. Data may be stored in magnetized regions of the shift register 10, such as the magnetic domains 30 and 35. Domain walls 36, 37, 38, and 39 are transition magnetized regions between the magnetic domains 30 and 35.

In operation, the magnetic domains 30 and 35 may change polarity orientation (states). The resistance of each of the magnetic domains 30 and 35 is partially dependant on the state of magnetic domains 30 and 35. The reading element 20 measures the resistance of the proximate magnetic domain 30, which indicates the state of the magnetic domain 30. The state of a magnetic domain 30 may be transferred to an adjacent magnetic domain 30 in a cascading cycle. Cycling states of the magnetic domain 30 allows the reading element 20 to read the states of the data stored in the shift register 10. The operation and formation of a similar memory device may be found in U.S. Pat. No. 7,551,469.

Figure 2:
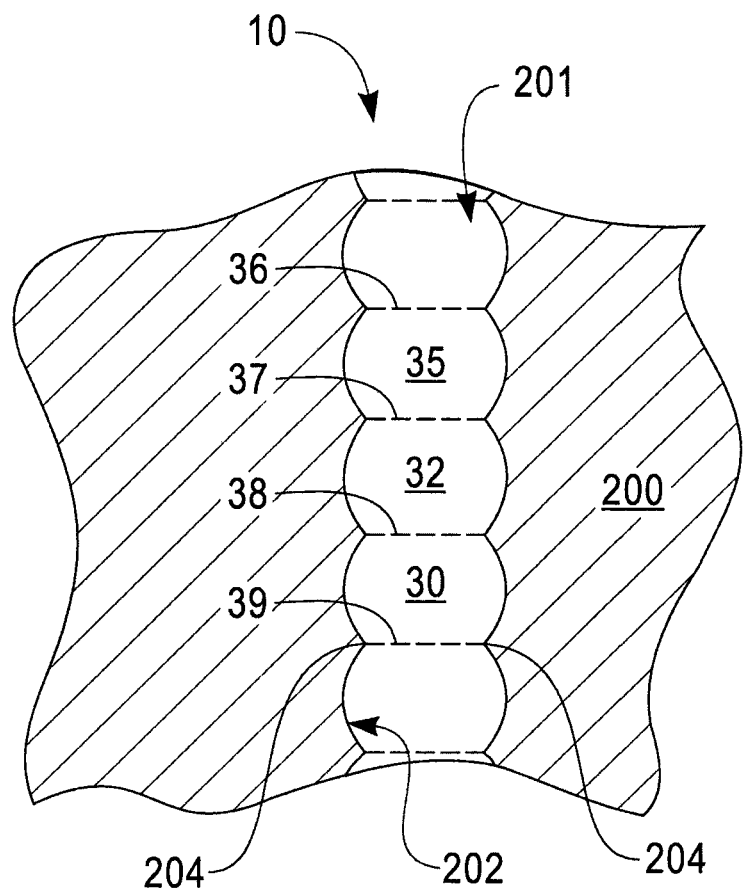
FIG. 2 illustrates a partially cut-away side view of a portion of the shift register.

FIG. 2 illustrates a partially cut-away side view of a portion of the shift register 10 formed in a substrate 200 such as, for example, a silicon material. In fabrication, a cavity 201 is formed in the substrate 200. The cavity 201 is filled with a ferromagnetic material such as, for example, an alloy formed substantially from one or more of Ni, Fe and Co or from an alloy formed from Fe and/or Co in combination with Pt and/or Pd or a Heusler alloy. The cavity 201 includes an inner surface 202 having an undulating profile or scalloped. The inner surface 202 includes ribs 204 that preferably define the domain walls 36, 37, 38, and 39 and the magnetic domains 30, 32, and 35. The ribs 204 are defined by an intersection of curved portions of the inner surface 201 and extend inwardly from the outer diameter of the cavity 201. Depending on the structure and type of the magnetic domain walls, the walls have a lower energy when sited either at or near the ribs 204 or within the cavities 30, 32, 35. The energy of the domain walls and their extension along the cavity 201 depends on the magnetic exchange energy of the magnetic alloy used to fill the cavity 201 and the magnetic anisotropy of the alloy. The greater the magnetic exchange energy, the larger the extent of the domain wall, whereas, a greater the magnetic anisotropy energy, results in a narrower domain wall. The anisotropy energy is largely composed of the intrinsic magnetocrystalline energy of the magnetic alloy and the demagnetizing energy. The former is largely a property of the alloy itself and is a result of the crystal structure and the composition of the alloy, whereas the latter depends on the geometry of the racetrack and the shape and structure of the domain wall. By varying the detailed topography of the ribs 204 and the internal surfaces of the cavities 202 the energy landscape of a domain wall along the racetrack can be varied so as to preferentially position the domain wall at or close to a rib 204 or within the cavities 202.

Figure 3:
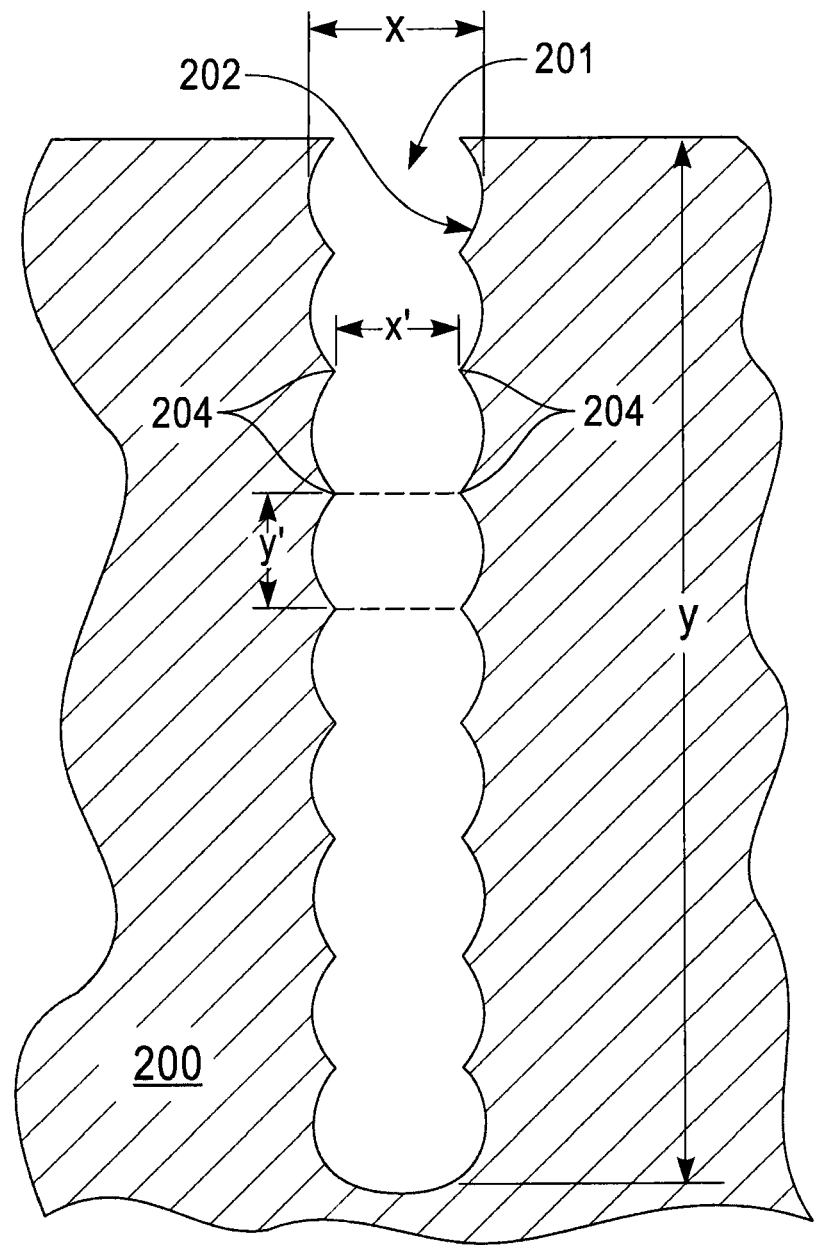
FIG. 3 illustrates the formation of a cavity.

FIG. 3 illustrates a cut-away side view of the formation of a cavity along the x direction. In the illustrated embodiment, a cavity 201 is formed in the substrate 200 using a patterning and etching process. The etching process may include, for example, cycles of alternating isotropic etching and passivating polymer deposition processes. In the illustrated example, the isotropic etching is a plasma etching process using $SF_6$, and the passivating polymer is $C_4F_8$, and the process conditions include the cycle: 1800 watts applied to the plasma source; 110 watts applied to the substrate 200; an equivalent chamber pressure of approximately 65 milliTorr, as controlled by a fixed pumping speed; and a flow of $SF_6$ at 300 standard cubic centimeters per minute (sccm) for 7 seconds; followed by a flow of $C_4F_8$ at 150 sccm for 2 seconds at $-10°$ C. Each cycle of etching and passivating polymer deposition increases the depth of the cavity 201 and forms the ribs 204 in the surface 202. The process conditions may be modified to result in a desired cavity width (x); rib dimension (x'); cell depth (y'); and cavity depth (y). For example, the number of cycles determines the cavity depth y, while the etching and polymer deposition conditions effect the x, x', and y' dimensions. Typical ranges of the $SF_6$ pulse include feedgas flow rates of 250-350 sccm for a duration of 5-9 seconds. The range of the $C_4F_8$ pulse includes a feedgas flow rate between 100-200 sccm and a duration between 1-5 seconds. Process temperature may range between $-20C$ to $50C$.

Referring to FIG. 3, the y length may have different dimensions. Thus the equivalent dimensions to x and x' i.e. y and y' may be designed to be larger or smaller than x and x' so as to allow for a elliptical cross-section of the cavity 201 rather than a uniform cross-section. When the magnetization of the cavity 201 is oriented within a plane formed by lines x and y (the xy plane) allows a unique direction of orientation of the magnetization of the alloy that forms the magnetic shift register 10 (of FIG. 1). When the magnetization of the magnetic shift register 10 is oriented perpendicular to the xy plane, it may be preferable that x and x' have the same dimensions as y and y', respectively.

The process conditions described above are mere examples. Other process conditions may be used to form the cavities 201 to meet the design specifications of the memory device 100 (of FIG. 1). For example, the process conditions may be adjusted when forming cavities in different regions of the substrate 200, and to form cavities with different cell depths and widths, cavity depths, and rib dimensions. Alternatively, a cryogenic etching process may be used that includes, for example, cycles of alternating isotropic etching and passivating oxidation processes.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a memory device, the method including:
    forming a cavity having an inner surface with an undulating profile in a substrate, wherein the cavity is formed by alternating isotropic etching and passivating polymer deposition processes and wherein a depth of the cavity is determined by a number of isotropic etching and passive polymer deposition process cycles;
    depositing a ferromagnetic material in the cavity;
    forming a reading element on the substrate proximate to a portion of the ferromagnetic material; and
    forming a writing element on the substrate proximate to a second portion of the ferromagnetic material.

2. The method of claim 1, wherein the undulating profile of the cavity includes rib portions operative to define domain walls defining magnetic domains in the ferromagnetic material.

3. The method of claim 1, wherein the ferromagnetic material defines a shift register in the ferromagnetic material.

4. The method of claim 1, wherein the isotropic etching and passivating polymer deposition processes includes a plurality of cycles each cycle including: 1800 watts applied to a plasma source; 110 watts applied to the substrate; an equivalent chamber pressure of approximately 65 milliTorr, controlled by a fixed pumping speed; and exposing the substrate to a flow of $SF_6$ at 300 standard cubic centimeters per minute (sccm) for 7 seconds.

5. The method of claim 4, wherein the plurality of cycles includes exposing the substrate to a flow of $C_4F_8$ at 150 sccm for 2 seconds at $-10°$ C. following the exposure of the substrate to the flow of $SF_6$.

6. The method of claim 1, wherein the substrate includes a silicon material.

7. The method of claim 1, wherein the cavity is formed by a cryogenic etching process.

8. A method for forming a memory device, the method including:
    forming a first cavity having rib portions in a substrate by alternating an isotropic etching process and a passivating polymer deposition processes and wherein a depth of the cavity is determined by a number of isotropic etching and passive polymer deposition process cycles;
    depositing a ferromagnetic material in the cavity, the ferromagnetic material including magnetic domains partially defined by the undulating profile of the cavity;
    forming a reading element proximal to a portion of the ferromagnetic material.

9. The method of claim 8, wherein the method further includes forming a writing element proximal to a second portion of the ferromagnetic material.

10. The method of claim 8, wherein the isotropic etching and passivating polymer deposition processes includes a plurality of cycles each cycle including: 1800 watts applied to a plasma source; 110 watts applied to the substrate; an equivalent chamber pressure of approximately 65 milliTorr, controlled by a fixed pumping speed; and exposing the substrate to a flow of $SF_6$ at 300 standard cubic centimeters per minute (sccm) for 7 seconds.

11. The method of claim 10, wherein the plurality of cycles includes exposing the substrate to a flow of $C_4F_8$ at 150 sccm for 2 seconds at $-10°$ C. following the exposure of the substrate to the flow of $SF_6$.

12. The method of claim 10, wherein the cavity is formed by a cryogenic etching process.

13. The method of claim 10, wherein the rib portions are defined by an intersection of curved surfaces of an inner surface of the cavity.

14. The method of claim 10, wherein the rib portions define domain walls in the ferromagnetic material.

* * * * *